US006219570B1

(12) United States Patent
Mueller et al.

(10) Patent No.: US 6,219,570 B1
(45) Date of Patent: Apr. 17, 2001

(54) ACTIVE ELECTRICAL DEVICE WITH AN ELECTRICAL LINE FOR OPERATION IN THE EXAMINATION VOLUME OF A NUCLEAR SPIN TOMOGRAPHY DEVICE

(75) Inventors: Edgar Mueller, Heroldsbach; Karsten Wicklow, Erlangen, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/190,087

(22) Filed: Nov. 12, 1998

(30) Foreign Application Priority Data

Nov. 12, 1997 (DE) .............................. 197 49 903

(51) Int. Cl.$^7$ ....................................... A61B 5/05
(52) U.S. Cl. ..................... 600/410; 600/425; 600/426; 324/318; 324/322
(58) Field of Search ..................... 600/407, 410, 600/425, 436; 324/318, 322

(56) References Cited

U.S. PATENT DOCUMENTS

| 4,922,204 | * | 5/1990 | Duerr et al. ..................... 324/322 |
| 5,065,760 | | 11/1991 | Krause et al. . |
| 5,477,147 | * | 12/1995 | Friedrich et al. ................ 324/322 |
| 5,855,553 | * | 1/1999 | Tajima et al. ..................... 600/407 |

* cited by examiner

Primary Examiner—Marvin M. Lateef
Assistant Examiner—Jeoyuh Lin
(74) Attorney, Agent, or Firm—Schiff Hardin & Waite

(57) ABSTRACT

In an active electrical device with an electrical line for operation in the examination volume of a nuclear spin tomography device, a sheath wave trap tuned to the operating frequency of the nuclear spin tomography device is installed in the line.

8 Claims, 3 Drawing Sheets

ACTIVE ELECTRICAL DEVICE WITH AN ELECTRICAL LINE FOR OPERATION IN THE EXAMINATION VOLUME OF A NUCLEAR SPIN TOMOGRAPHY DEVICE

BACKGROUND OF THE INVENTION

1. Field of the Invention

The present invention relates to an electrical device with an electrical line for operation in the examination volume of a nuclear spin tomography device wherein a sheath wave trap tuned to the operating frequency of the nuclear tomography device is installed in the line.

2. Description of the Prior Art

In nuclear spin tomography devices it is occasionally necessary to lead lines to devices which lie within the examination volume of the nuclear spin tomography device. Problems arise therein particularly when lines are located in the region of transmitting antennas. During the transmission phase there are high electromagnetic fields in the examination volume. Coupling events result between the typically shielded lines and the transmitting antenna of the nuclear spin tomography device via the cable shielding by what are known as sheath waves.

The coupling of the antenna field occurs magnetically (inductively) and electrically (capacitively). This coupling can lead to considerable disturbances of not only the image quality but also the electronic components. An even more serious problem is that local field overelevations of the high frequency field can occur due to such couplings. If electrical lines lie too close to a patient, such field overelevations also lead to a sharp increase of the HF power in the neighboring tissue.

Previously, the problem of electrical lines in the transmission field of a nuclear spin tomograph was solved only for passive components. For the present case, this means local coils and sensors such as for EKG, EEG or breathing signals, in particular. In U.S. Pat. No. 5,065,760, primarily two measures were proposed for avoiding the coupling problem. First, the leading of a cable in a shielded cable channel that is arranged in a zone of low HF field strength, and optimally short "free" cable leading to an apparatus arranged at the patient via a plug connector at a patient bed. Second, the installation of a sheath wave filter in the plug connector.

In EKG and EEG sensors, the problem has been further solved in that lines with relatively high electrical resistance are employed which sharply attenuate a HF coupling. For active electrical devices, particularly video displays, sound converters, manually operable control devices and the like, there has been no satisfactory solution until now. Such devices, therefore, usually have not been employed in the transmission field of the nuclear spin tomography device. This can be achieved by transmission with a local coil instead of a whole-body antenna, for example. Such a limitation is unsatisfactory, however, since a more homogenous irradiation of the HF field is achieved with a whole-body antenna than with a local coil.

The known solution for local coils with a sheath wave trap in the plug connector is not, however, sufficient for the use of the abovementioned active electrical devices, since greater line lengths are typically necessary therein and the danger is greater that a cable lies immediately adjacent to the patient. On the other hand, in local coils a lateral connection is typically provided via which a line can be connected to the plug connector without there being a danger that the line lies directly on the patient.

Accordingly, it is an object of the present invention to construct an active electrical device of the abovementioned type such that HF interference is largely avoided when the line lies in the transmission range of a nuclear spin tomography device.

SUMMARY OF THE INVENTION

This object is inventively achieved in that at least one sheath wave trap that is tuned to the operating frequency of the nuclear spin tomography device is built into the line of the electrical device of the present invention. HF interferences between the transmitting antenna and the line are thus largely avoided. Thus, active electrical devices also can be operated in the transmission range of a nuclear spin tomography device without extreme field overelevations arising in the region of the lines and causing increased HF load and image artefacts.

Accordingly, in an embodiment of the present invention, an active electrical device for operation in the examination volume of a nuclear spin tomography device is provided which includes an electrical line attached to the active electrical device, and a first sheath wave trap installed in the line wherein the first sheath wave trap is tuned to the operating frequency of the nuclear tomography device.

In an embodiment, an electrical outer insulation which is at least 5 mm thick surrounds the electrical line wherein the electrical outer insulation guarantees a corresponding spacing between supporting surfaces of the electrical line and electrical conductors of the electrical line.

In a further embodiment of the present invention, an active electrical device for operation in the examination volume of a nuclear spin tomography device is provided which includes an electrical line attached to the active electrical device, and an electrical outer insulation which surrounds the electrical line wherein the electrical outer insulation guarantees a corresponding spacing between supporting surfaces of the electrical line and electrical conductors of the electrical line.

In an embodiment, the active electrical device further includes a plug connector on the electrical line wherein a length of the electrical line extends from a site of the active electrical device to a plug counter part arranged in an area of a patient bed.

In an embodiment, a second sheath wave trap is installed in the plug connector.

In an embodiment, a second sheath wave trap is installed in the electrical device itself.

In an embodiment, the active electrical device further includes a video display.

In an embodiment, the active electrical device further includes a sound generator.

Additional features and advantages of the present invention are described in, and will be apparent from, the Detailed Description of the Preferred Embodiments and the Drawings.

DETAILED DESCRIPTION OF THE PREFERRED EMBODIMENTS

Figure 1:
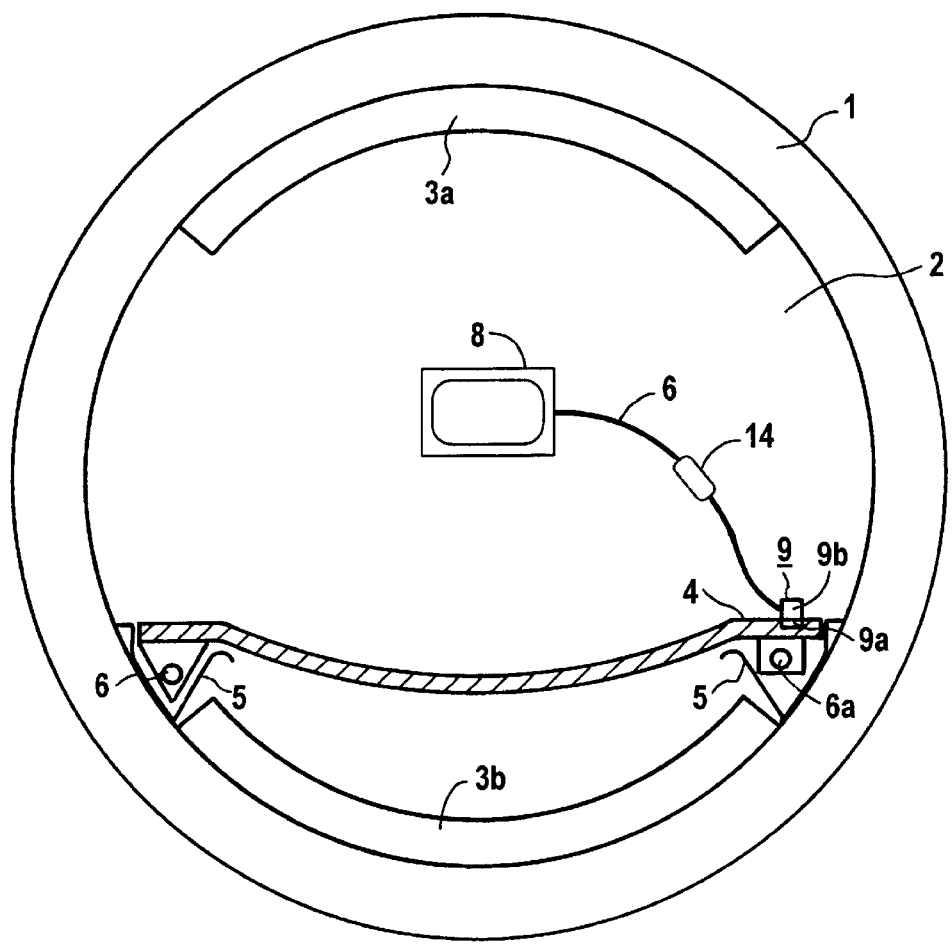
FIG. 1 shows the leading of a line in a nuclear spin tomography device.

FIG. 1 schematically depicts a nuclear spin tomography device with a whole-body antenna wherein for the sake of surveyability only the components necessary for explanation of the invention are depicted. The nuclear spin tomography device generally consists of a superconductive magnet 1 with a cylindrical opening 2. A whole-body antenna 3, consisting of two subantennas 3a and 3b, is attached at the walls of the opening 2; HF impulses being transmitted and, if local coils are not employed for this purpose, potentially received therewith. The HF field of the whole-body antenna 3 should be optimally homogenous over the examination region. The patient is driven into the opening 2 of the magnet 1 on a patient bed 4.

Figure 2:
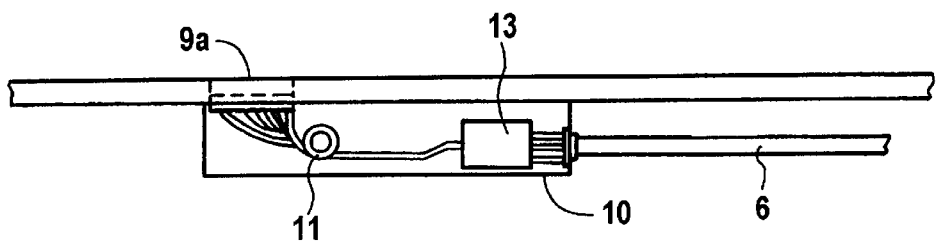
FIG. 2 shows the arrangement of a plug connector in a bed.

In the embodiment shown in FIG. 1, a monitor 8 is arranged in the examination room, this being connected to an upper part 9a of a plug connector 9 via a line 6. Video signals, audio signals, control signals and the power supply are led via the line 6. The line 6 is connected via the plug connector 9 to another line 6a leading out of the cylindrical opening room 2 of the nuclear spin tomography device. This line 6a lies beneath the patient bed 4 in one of the cable channels 5, wherein the cable channels 5 are arranged on either side of the patient bed 4. The cable channels 5 are attached directly at the outer wall of the opening 2 above the subantenna 3b. The cable channels 5 are electrically conductive and grounded so that HF barely interferes on the line part 6a. The plug connector attached at the patient bed 4 is further detailed in FIG. 2. The plug connector can be installed in a terminal unit 10, for example, wherein the lines coming from the lower plug part 9a are led via a sheath wave trap 11 and, if necessary, via a preamplifier 13 to the line 6a, which then leads out of the magnet via the cable channel 5.

As depicted in FIG. 1, a sheath wave trap 14 that largely attenuates an HF interference is installed in the line 6. There is consequently no danger of an impermissibly high HF interference on the patient if the line 6 rests directly on the patient. A plurality of such sheath wave traps 14 can be potentially installed at 30 cm intervals in longer lines 6.

Figure 3:
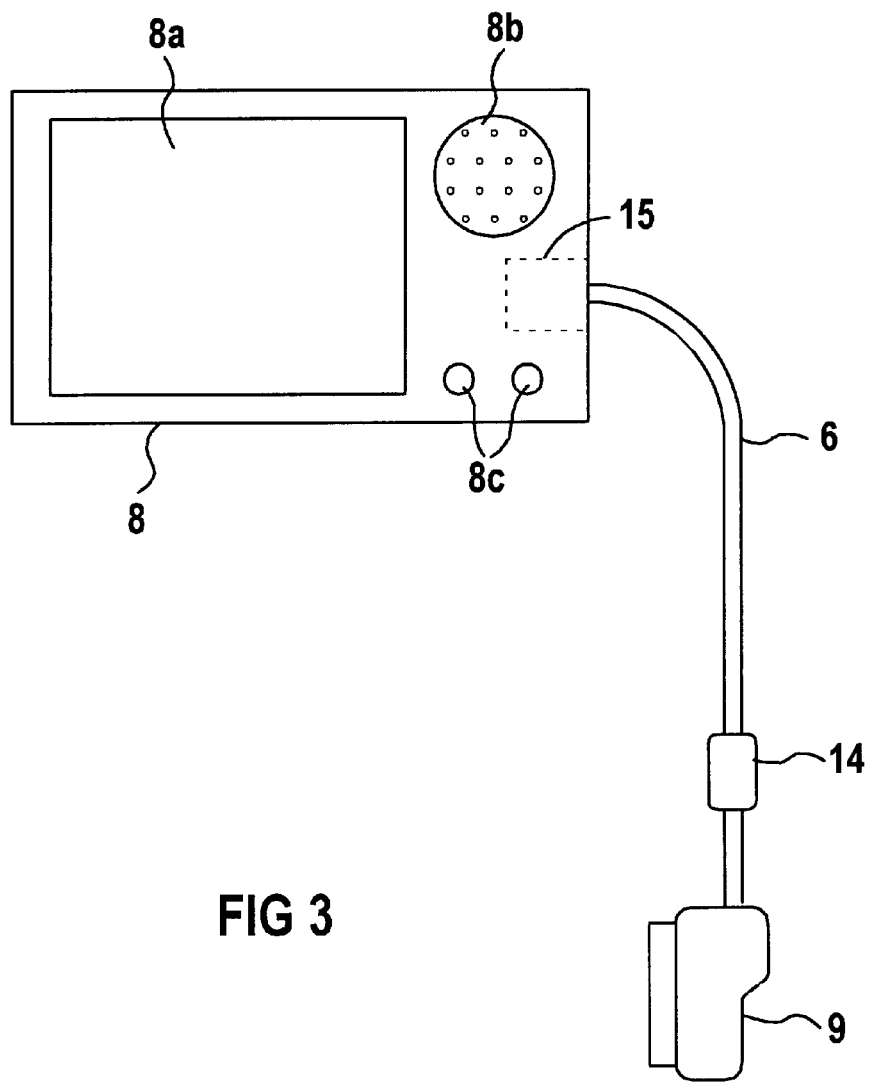
FIG. 3 shows the arrangement of a sheath wave trap in the line of FIG. 1 in a sectional view.

The montior 8 with line 6 is depicted in enlarged fashion in FIG. 3. The device itself can include a video display 8a, a loudspeaker 8b and operating elements 8c, for example. It should be emphasized, however, that the device 8 is depicted in this form only as an example of application, and that the principle claimed herein can be applied to all electrical devices which are meant for operation in the transmission field of a nuclear spin tomograph and which include an electrical line.

Figure 4:
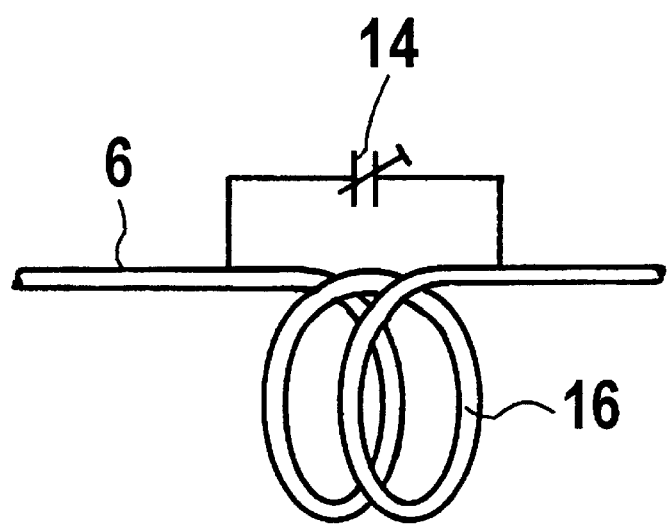
FIG. 4 shows the circuit of a sheath wave trap.

The monitor 8 itself also can contain a sheath wave trap 15 (FIG. 3, dashed line). One possible embodiment for a sheath wave trap is depicted in FIG. 4. The sheath wave trap is implemented as a parallel oscillating circuit consisting of a coil 16 wound from the line 6 and a capacitor 14 that bridges this coil 16 and is connected to the sheath conductor of the shielded line 6. A resonance circuit thus results which is dimensioned such that it is tuned to the operating frequency of the nuclear spin tomography device. The sheath wave trap 15 prevents the transfer of the HF power onto the shield conductor of the line 6 which is coupled by the transmitting antenna.

Figure 5:
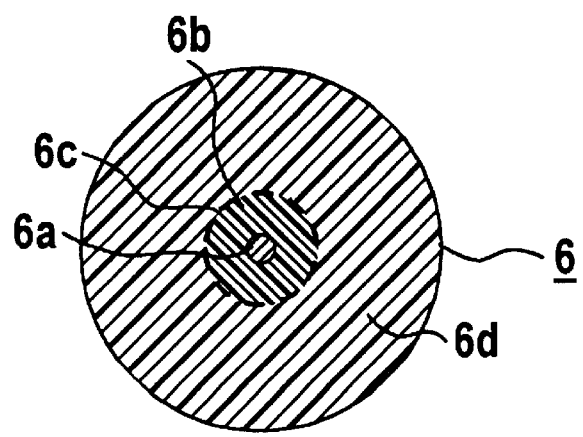
FIG. 5 shows the construction of a line with a thick insulation.

An additional or alternative measure for avoiding impermissible HF powers in the patient, given the adjoining of the line 6, is depicted in FIG. 5. The line 6 with the inner conductor 6a, the inner insulation 6b and the coaxial sheath conductor 6c is surrounded by a thick insulation 6d which acts as a kind of spacer with respect to the patient. This measure alone already suffices to prevent an impermissible HF loading of the patient given an adjacent line 6. The thick insulation also can be provided as an auxiliary measure to the installation of sheath wave traps in the line.

With the measures depicted, it is possible to operate an electrical device such as a monitor in the transmission field of a nuclear spin tomography device without endangering the examined patient by excessive HF loading, and without impairing the data transmission via the line.

Although the present invention has been described with reference to specific embodiments, those of skill in the art will recognize that changes may be made thereto without departing from the spirit and scope of the invention as set forth in the hereafter appended claims.

We claim as our invention:

1. An active electrical device for operation in the examination volume of a nuclear spin tomography device, comprising:

an electrical line attached to the active electrical device for transmitting information containing signals and operating current to said electrical device; and a sheath wave trap installed in the line, the sheath wave trap tuned to the operating frequency of the nuclear tomography device.

2. An active electrical device as claimed in claim 1, further comprising:

an electrical outer insulation surrounding the electrical line at least 5 mm thick, the electrical outer insulation guaranteeing a corresponding spacing between supporting surfaces of the electrical line and electrical conductors of the electrical line.

3. An active electrical device as claimed in claim 1, further comprising:

an electrical outer insulation surrounding the electrical line, the electrical outer insulation guaranteeing a corresponding spacing between supporting surfaces of the electrical line and electrical conductors of the electrical line.

4. An active electrical device as claimed in claim 1, further comprising:

a plug connector on the electrical line, wherein a length of the electrical line extends from a site of the active electrical device to a plug counterpart arranged in an area of a patient bed.

5. An active electrical device as claimed in claim 4, wherein said sheath wave trap is a first sheath wave trap, and further comprising:

a second sheath wave trap installed in the plug connector.

6. An active electrical device as claimed in claim 1, wherein said sheath wave trap is a first sheath wave trap, and further comprising:

a second sheath wave trap installed in the electrical device.

7. An active electrical device as claimed in claim 1, further comprising a video display.

8. An active electrical device as claimed in claim 1, further comprising a sound generator.

\* \* \* \* \*